United States Patent [19]
Hode et al.

[11] Patent Number: 5,475,348
[45] Date of Patent: Dec. 12, 1995

[54] SURFACE WAVE FILTER FILTERING DELAY TRANSFER FUNCTION

[75] Inventors: Jean-Michel Hode, Valbonne; Jean Desbois, Roquefort les Pins; Marc Solal, Antibes, all of France

[73] Assignee: Thomson-CSF, Paris, France

[21] Appl. No.: 211,622

[22] PCT Filed: Oct. 28, 1992

[86] PCT No.: PCT/FR92/00827

§ 371 Date: Apr. 18, 1994

§ 102(e) Date: Apr. 18, 1994

[87] PCT Pub. No.: WO93/08641

PCT Pub. Date: Apr. 29, 1993

[30] Foreign Application Priority Data

Oct. 18, 1991 [FR] France .................... 91 12882

[51] Int. Cl.⁶ .................................................. H03H 9/64
[52] U.S. Cl. .......................... 333/195; 333/151; 333/194
[58] Field of Search ................................ 333/193–196, 333/151; 310/313 D

[56] References Cited

U.S. PATENT DOCUMENTS

| | | | |
|---|---|---|---|
| 4,390,854 | 6/1983 | Colvin | 333/196 |
| 4,609,891 | 9/1986 | Solie et al. | 333/195 |
| 4,764,701 | 8/1988 | Garbacz et al. | 333/151 |
| 5,264,751 | 11/1993 | Dufilie et al. | 333/154 |
| 5,296,624 | 3/1994 | Cho et al. | 333/195 |
| 5,319,326 | 6/1994 | Fleischmann et al. | 333/196 |

OTHER PUBLICATIONS

"Tunable Variable BW/Frequency SAW Resonators", *31st Annual Freq. Control Symposium*, Jeff Schownwald, pp. 240–245.

*Primary Examiner*—Robert J. Pascal
*Assistant Examiner*—Darius Gambino
*Attorney, Agent, or Firm*—Oblon, Spivak, McClelland, Maier, & Neustadt

[57] ABSTRACT

It consists of several channels (V1, V2) in parallel, which exhibit an inter-transducer gap difference ($2_1$–$4_1$; $2_2$–$4_2$) equal to an even multiple of the half-wavelength ($\lambda$) at the central frequency, from one channel to the next, so as to cancel the delay line transfer function which corresponds to the direct path between transducers.

20 Claims, 6 Drawing Sheets

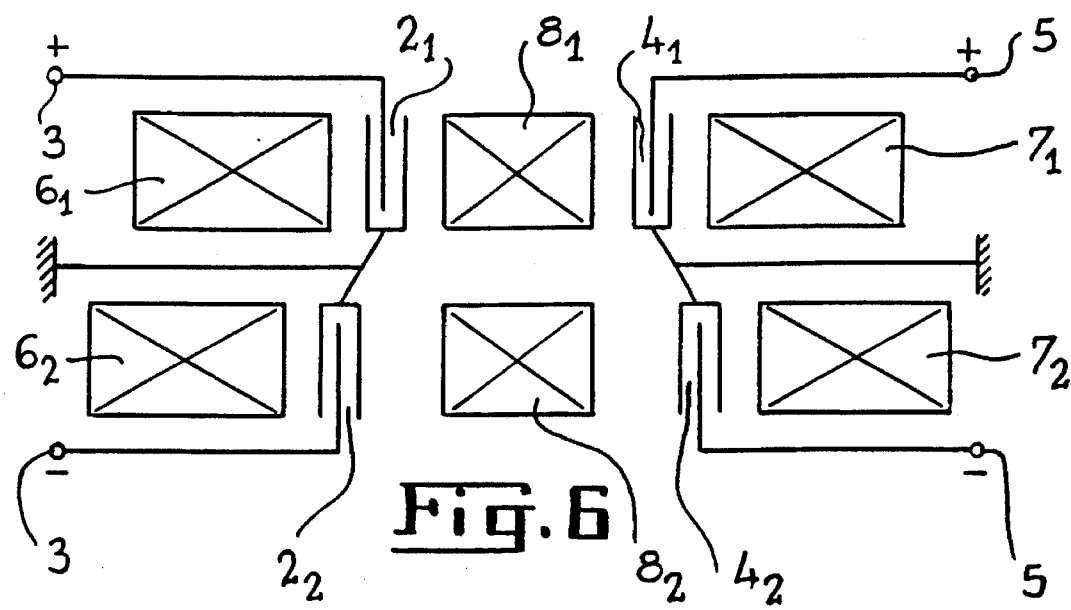
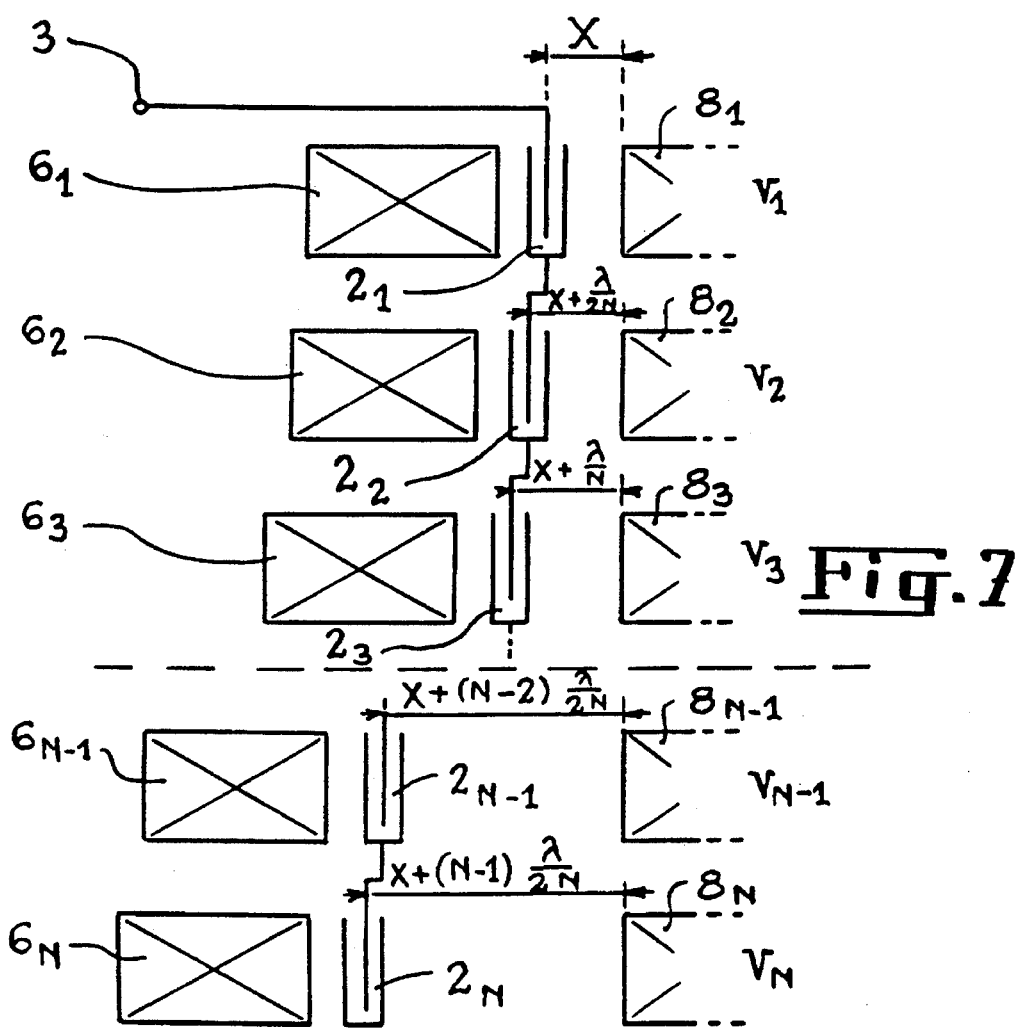

SURFACE WAVE FILTER FILTERING DELAY TRANSFER FUNCTION

BACKGROUND OF THE INVENTION

1. Field of the Invention

The present invention relates to a surface acoustic wave filter, this filter being a filter whose acoustic path has been folded back.

2. Description of the Related Art

A filter of this type generally includes, on a single substrate, at least one input transducer, at least one output transducer, both bi-directional and both placed on this substrate so as to define, in respect of the surface acoustic waves, a longitudinal direct path between these two transducers, at least two reflecting gratings or "reflectors" being moreover provided respectively on this substrate on either side of this pair of transducers and on this longitudinal axis of propagation of the surface acoustic waves, so that the centres of transduction of the transducers lie on antinodes of the resonant cavity.

In this regard, a "two pole" filter with longitudinally coupled resonant cavities of the prior art is represented diagrammatically in FIG. 1 attached.

This filter includes, on a single substrate 1 and aligned with the longitudinal axis Y of propagation of the surface acoustic waves symmetrically with respect to the inter-transducer mid-line (L):

- an input transducer 2 which receives the microwave signal applied between the electrical input terminals 3 of the filter and which transforms this signal into surface acoustic waves of like frequency moving, in one and the opposite direction, over the substrate 1 and in the longitudinal direction Y;
- An output transducer 4, identical to the transducer 2, and capable conversely of transforming the surface acoustic waves into electrical signals extracted on the electrical output terminals 5 of the filter.

Two identical "outer" reflecting gratings 6 and 7 placed respectively, and symmetrically, on either side of the substrate 1. These gratings are conventionally formed by a periodic or quasi-periodic grating of elementary reflectors, the period between reflecting elements being an integer multiple of half-wavelengths at the central frequency of operation of the filter.

A "central" reflecting grating 8 provided between the two transducers 2, 4, along the Y axis and in the middle of the interval separating these two transducers, the distances X between each of these transducers and the closest edge of this central reflector 8 being equal. This grating 8 has the same periodicity as the outer gratings 6, 7. On the other hand, it exhibits a non-negligible transmission coefficient, unlike these outer gratings which are in practice reflecting only. These reflecting gratings (outer and central) may as appropriate be weighted to improve their off-band response (increase in rejection).

Outside the "stop band" of the filter (that is to say the frequency band in which the gratings are reflecting), the device behaves like a simple delay line, only the direct path between the input transducer 2 and the output transducer 4 being taken into account.

In the stop band, this direct path still exists, but furthermore the device operates as two longitudinally coupled resonant cavities:

a first resonant cavity defined by the two reflectors 6 and 8, a second resonant cavity defined by the two reflectors 7 and 8.

The electromechanical coupling with these resonant cavities is obtained through the input/output transducers 2, 4. Depending on the value of this coupling, the magnification from the cavities is greater or smaller and consequently the relative bandwidth of the device lower or higher. Similarly, the coupling between the two cavities (that is to say the transmission from the central grating) must be matched to the relative bandwidth to be produced.

Thus, when this coupling is weak, the number of outward/return paths between the gratings is large, the energy remaining confined in the cavities for a long time. The impulse response is lengthy and the relative bandwidth low: operation is that of a resonator with high magnification factor.

Conversely, when this coupling is strong, a sizeable fraction of energy is absorbed by the transducers with each passage of the surface acoustic wave. The impulse response is then short and the relative bandwidth large: operation is that of a resonator with low magnification factor.

Note that in the absence of central reflector 8, operation is that of a filter with a single resonant cavity defined by the two outer reflectors 6, 7: we then have a "one pole" filter, whilst the device of FIG. 1 is a "two pole" filter, with steeper flanks.

In the case of this kind of surface wave filter with at least one resonant cavity, the presence of the direct path causes the appearance of side lobes whose level is all the higher when it is desired to widen the relative pass band of the filter. The presence of these side lobes renders this kind of filter practically unusable for wide relative bandwidths.

SUMMARY OF THE INVENTION

In order to alleviate this disadvantage the invention proposes a surface acoustic wave microfrequency filter with longitudinal resonant cavities, this filter being composed of an integer number N, equal to at least 2, of parallel filtering channels each including a bi-directional input transducer and an output transducer defining a direct path between the two of them, and at least two reflecting gratings, defining for this channel at least one longitudinal resonant cavity, the transmission amplitudes being, at least for these direct paths practically the same for these channels; this filter being principally characterized in that the difference in propagation length in the direct path is, for two consecutive channels, substantially equal, to within an integer number of wavelengths at the central filtering frequency, to one Nth of this wavelength, so that finally, for this central frequency, the vector resultant of the signals of these N channels which correspond to the direct paths is practically zero and that in consequence there is practically cancellation of the delay line transfer function outside the stop band of the filter.

BRIEF DESCRIPTION OF THE DRAWINGS

Anyhow, the invention will be clearly understood and its advantages and other characteristics will emerge during the following description of a few non-limiting illustrative embodiments, with reference to the attached diagrammatic drawing in which:

FIGS. 5 and 6 show diagrammatically two variants, among others, of electrical wiring of this same filter;

FIG. 7 shows, in a generalized way, a structure of such a filter including N channels instead of two;

DETAILED DESCRIPTION OF THE PREFERRED EMBODIMENTS

Figure 1:
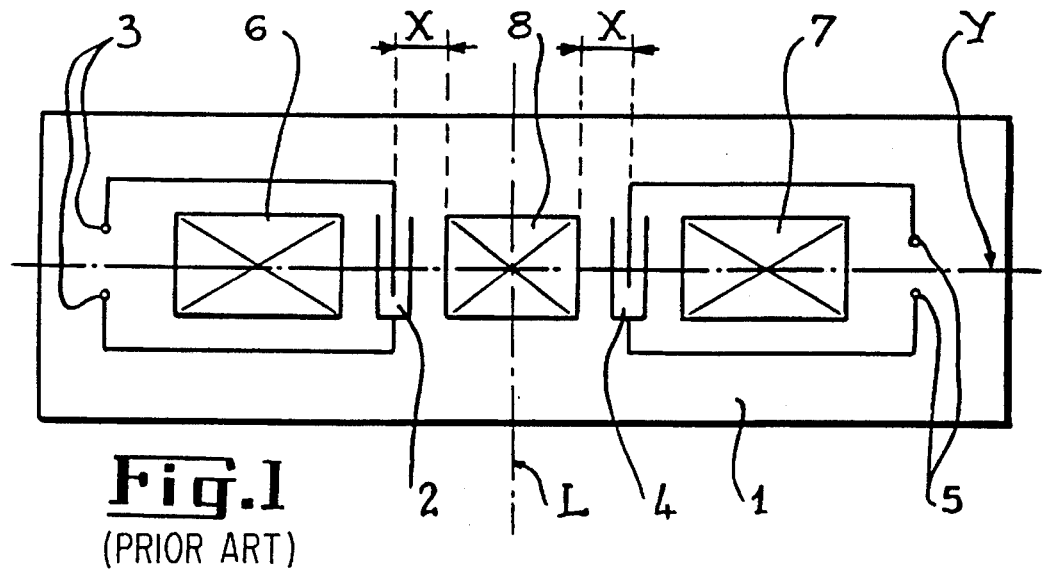
FIG. 1 shows a conventional filter.
Figure 2:
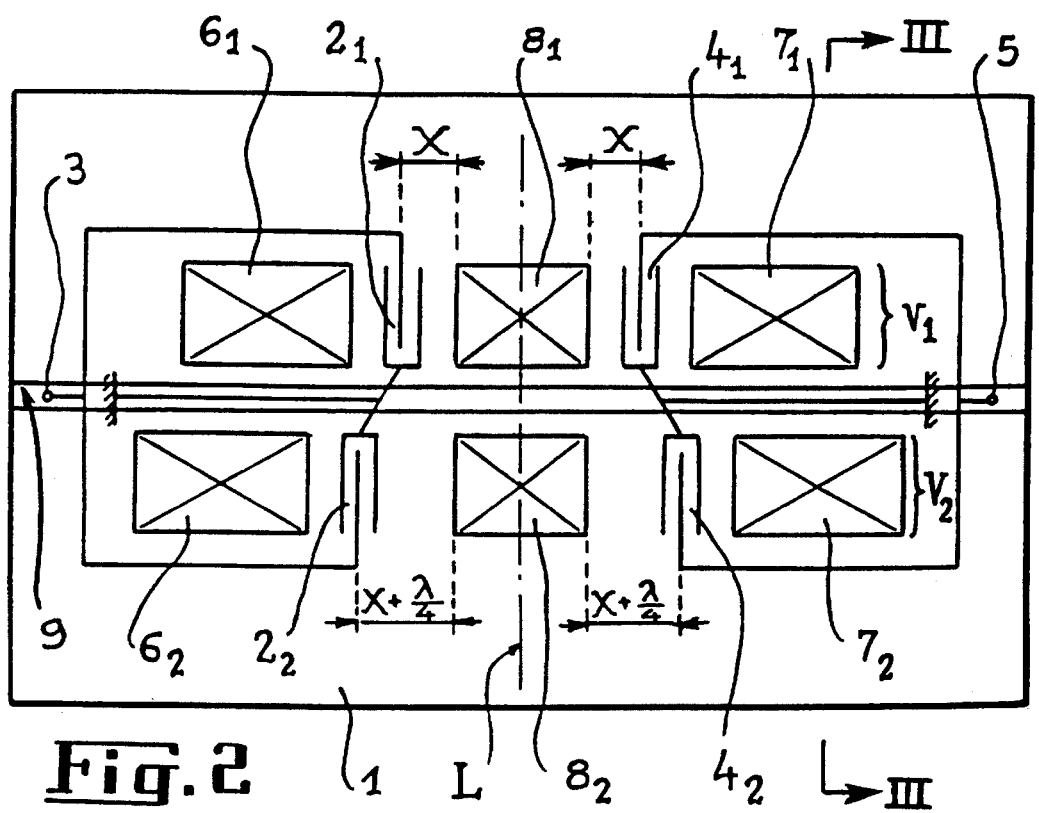
FIG. 2 is a plan view of a first embodiment of this filter.
Figure 3:
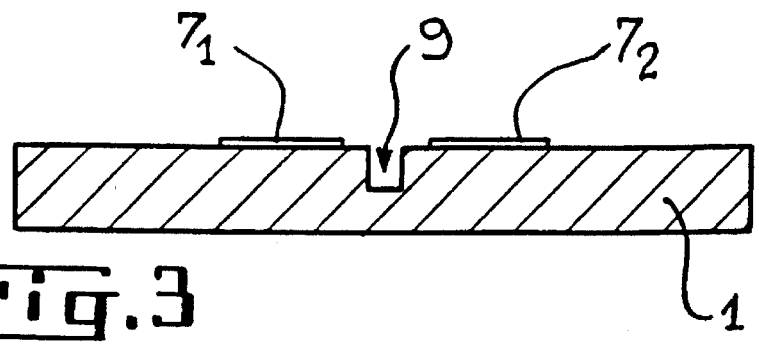
FIG. 3 is a simplified sectional view along III—III of FIG. 2.

Referring to FIGS. 2 and 3, we have an acoustic wave filter of the same type as that of FIG. 1, but including two channels in parallel between the input/output output terminals 3, 5:

a first channel or track V1 consisting per se of a filter similar to that of FIG. 1, and thereby including a central reflector $8_1$ placed at equal distances X from the input transducer $2_1$ and from the output transducer $4_1$, and two outer reflectors $6_1$ and $7_1$ placed symmetrically and on either side of these two transducers; and a second channel V2 or track which, with its input/output transducers $2_2$, $4_2$, its central reflector $8_2$, and its outer reflectors $6_2$, $7_2$, is practically identical to channel V1, apart from the essential difference that, in accordance with the invention, the distances separating the transducers $2_2$ and $4_2$ from the closest edge of the central reflector $8_2$ are here equal to $X+\lambda/4$, where $\lambda$ is the wavelength corresponding to the central frequency of the electrical signal, rather than equal to X.

All the active and passive elements of the channels V1 and V2 being identical, the transmission amplitudes of these two channels are the same. It follows that, given the difference in direct paths $2_1$–$4_2$ and $2_2$–$4_2$ between the two channels V1 and V2 which is equal to $\lambda/2$, the vector resultant of the signals extracted from the output transducers $4_1$, $4_2$ and corresponding to the direct path is zero. There is therefore practically, in the response curve of this filter, cancellation of the delay line transfer function outside the stop band of the filter, this result being of course, as we will come to later, only strictly true for the central frequency of the filter.

On the other hand, the multiple reflected paths for which there exist between the two paths V1, V2 differences which are equal to an even multiple of half-wavelengths are all in phase at output, or paths of even order, and are therefore unaffected by this offset between channels.

Note that if the elements of the filter were all purely and simply placed on a single substrate such as that of FIG. 1, parasitic couplings would appear between the channels due to the not strictly longitudinal surface waves and thereby travelling from one channel to the other.

In accordance with an advantageous aspect of the invention, this disadvantage is avoided without it being necessary to provide a separate substrate for each of the channels V1 and V2, through the fact that a longitudinal trench or groove 9 is gouged longitudinally in the single substrate 1 so as to separate physically and surface-wise channels V1 and V2.

The surface waves then hardly propagate from one channel to the other, on the other hand the electrical connections between channels may for example be embodied without problem by a technique of wire connection above this groove 9.

Figure 4:
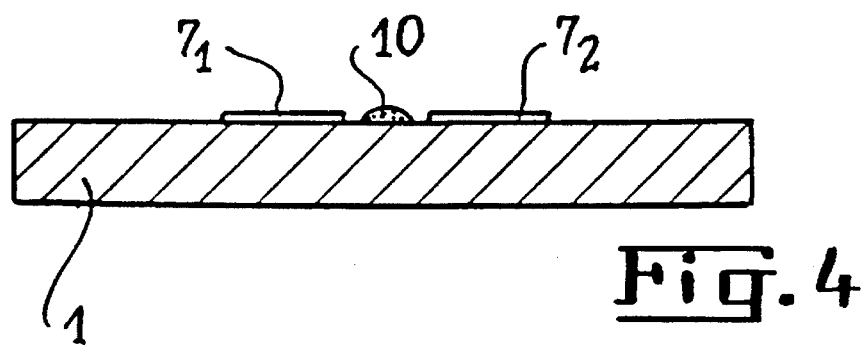
FIG. 4 shows, in a manner similar to FIG. 3, a manufacturing variant of the filter according to FIG. 2.

As a variant, as represented in FIG. 4, it is possible, instead of gouging this trench 9, to deposit at the same place a longitudinal layer 10 of a material which is absorbent in respect of the surface acoustic waves, such materials being available on the market without problem.

To avoid acoustic coupling between these channels V1 and V2, it is also possible to offset these channels longitudinally with respect to one another, choosing this offset so that the two crossed paths "V1 to V2" and "V2 to V1" are in phase opposition. This offset depends on the acoustic aperture of the channels as well as on their separation.

Note that in this example, the input transducers $2_1$, $2_2$ on the one hand, and the output transducers $4_1$, $4_2$ on the other hand, are connected electrically in parallel. Their admittances add together, thus reducing the output impedance: such a configuration is well suited to low-impedance outputs.

It goes without saying that this mode of connection is optional and that all the other configurations are realizable from the electrical standpoint without changing the result due to the invention: series-series configuration (inputs and outputs respectively), parallel-series, series-parallel, differential set-ups with earthed or unearthed centre-tap, etc.

Figure 5:
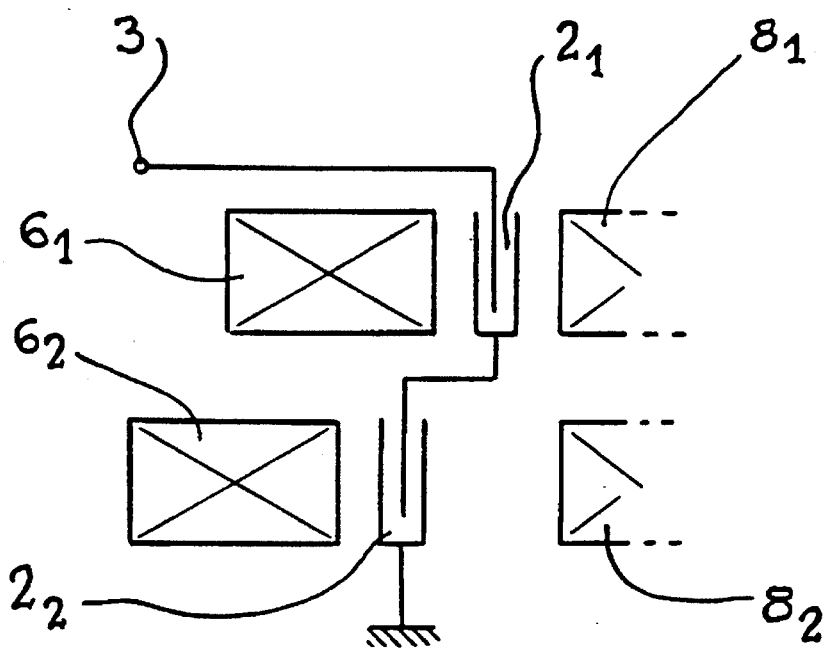

FIG. 5 shows for example, for this filter according to FIG. 2, a series configuration of the input transducers $2_1$, $2_2$. The same configuration being used for the output transducers (not represented), this time it is the impedances which add together, consequently increasing the output impedance of the filter: this configuration is suited to high-impedance outputs.

Another illustrative connection is given in FIG. 6, which relates to wiring in a differential set-up, such a set-up being suited to this type of electronics in which the circuits are supplied symmetrically with respect to earth; etc.

It goes without saying that the two-channel structure according to FIG. 2 is merely preferential, and may undergo modifications without departing from the scope of the invention. Thus, the difference in direct paths may be equal to $\lambda/2+p\lambda$, p being an integer number, this of course changing nothing as regards the cancellation of the delay line transfer function, that is to say in the direct path outside the stop band. The symmetrical nature of each channel with respect to the central reflector is preferential, but not necessarily obligatory. The reflectors may be different for each of these two channels, even if the condition of identity of the transmission amplitudes is satisfied. In certain cases, it may well be possible to dispense with the central reflectors, etc.

Assuming the central reflecting gratings $8_1$, $8_2$ to be symmetric and lossless, the reflection coefficient r and transmission coefficient t are of the form:

$r = j \sin \Delta . e^{-j\phi}$ $t = \cos \Delta . e^{-j\phi}$

If R is the reflection coefficient of the outer gratings, the transfer function of the filter is of the form: $R. \sin 2\Delta$.

To minimize the losses, there must advantageously be an angle $\Delta$ equal to $\pi/4$, in which case the moduli of r and of t are equal to $1/\sqrt{2}$ at the central frequency. Moreover, the matching circuits match, at this frequency, the source and load impedances to the impedance which would be exhibited by the pairs of transducers with their associated outer gratings.

Note that it is nevertheless possible to accept a downgrading from the standpoint of insertion losses in order to alter the width of the band.

The reflection coefficient of the central reflector should be close to −3 dB, this corresponding to as much reflected energy as transmitted energy. Furthermore, to improve rejection (off-band level), the central reflector can be weighted. In a known manner, this weighting will for example be obtained by source suppression (the sources being the reflectors) and the number of reflectors will be adjusted so as to have a reflection coefficient close to −3 dB. Depending on the number of suppressed sources, the grating is more or less "undersampled", that is to say there are empty gaps between the reflectors.

To retain a constant metallization ratio, useful by virtue of the turn-over temperature variations due to the metallization, these empty gaps will be filled in with non-reflective cells embracing for example 2 electrodes with a period $\lambda/4$, or else 3 electrodes with a period $\lambda/3$.

Figure 13:
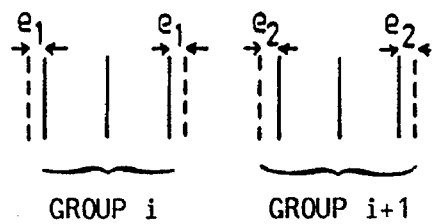
FIG. 13 shows a variant weighting of the reflector cells.

According to a variant the weighting can also be obtained by forming groups of reflectors which are slightly offset so as to weight the reflection coefficient specific to each group as represented in FIG. 13 for a group i with an offset $e_1$ and a group i+1 with an offset $e_2$.

The illustrative embodiment just described is applied to a filter including two channels V1 and V2 in parallel.

The invention nevertheless applies just as well for a number N of channels greater than two, as shown diagrammatically (for one side only) in FIG. 7.

The difference in direct path between the two consecutive channels is then, in such a case, equal to $\lambda/N$ of course to within an integer number of wavelengths $\lambda$, so that the vector resultant of all the direct paths of the channels V1 to VN is zero.

With the symmetrical arrangement, similar to that of FIGS. 2 and more precisely 5, adopted for FIG. 7, the distances between input transducer 2 and central reflector 8 are:

X for channel V1

X+$\lambda/2N$ for channel V2

X+$\lambda/N$ for channel V3

X+(N−2).$\lambda/2N$ for channel VN-1 and X+(N−1).$\lambda/2N$ for channel VN.

The transfer function of the filter is equal to the sum of all the contributions. In the case of N symmetrical channels (labelled from 1 to N) and offset by $$X + \frac{2n - (N+1)}{2N}(kN+1),$$

$$\sum_{n=1}^{N} F_n[(kN+1)n\pi f/fo] R^{n-1} e^{(-jn\phi)} \left\{ \begin{array}{l} \cos n\Delta \\ j\sin n\Delta \end{array} \right\} \begin{array}{l} \ldots n \text{ odd} \\ Tea_1 \cdot Tea_2 \\ \ldots n \text{ even} \end{array}$$

where R is the reflection coefficient of the gratings, $\phi$ the phase corresponding to the mean inter-transducer distance and $Tea_1$ and $Tea_2$ the electroacoustic transfer functions of the assembly consisting of the input transducer and output transducer and of the rear reflecting gratings. Through the interplay of the phase differences between channels, the filtering functions Fn are all zero at the central frequency with the exception of FN. It is thus seen how the assembly of reflectors participates directly in the transfer function.

Near the central frequency of the filter, the transfer function of the filter is of the form:

for N even: $R^{N-1} \sin(N\Delta)$ for N odd: $R^{N-1} \cos(N\Delta)$.

For the off-band rejection, N even is preferable so as to benefit from a surfeit in rejection due to the response of the central reflector, since $\Delta$ tends to zero outside the pass band.

It is nevertheless possible to move away from these solutions for the purpose of altering the form and width of the pass band.

Near the central frequency of the filter, the transfer function of the filter is of the form: $R^{N-1} \cdot \sin(N\Delta)$ (for N even). The only non-zero contribution to the central frequency is the last term related to the Nth path (this is the principle of the structure). The filtering functions Fn convey the placing in parallel of the N channels. They are all, except FN, zero at the central frequency but exhibit a finite bandwidth which becomes smaller as (kN+1) becomes larger. The most favourable case is therefore obtained for k=0. Given that the transfer function tends to 0 outside the pass band, the spurious contributions from this effect are those from the paths of odd order (giving rise to cosines) and more particularly the direct path which is not filtered at all by rear reflectors.

To fix matters, rejection in direct operation is, for the particular case N=2 (2 channels) and in the most favourable case k=0:

total for f=fo 36 dB for f=(1±1%) fo 22 dB for f=(1±5%) fo 10 dB for f=(1±20%) fo In order to alleviate this disadvantage, and hence further improve direct path rejection, a variant of the present invention consists in placing in parallel two structures with multiple channels according to FIG. 2, and more generally according to FIG. 7, these structures being of the same type, but the offsets of the direct paths varying in opposite directions from one structure to the other with respect to the longitudinal axis Y of symmetry of the assembly and on proceeding away from the latter, although the relative offsets between channels are equal in absolute values for each of these two structures.

In other words this variant amounts to embodying a filter by using two previous structures, each with N channels, so as to afford further rejection on all the paths of odd order, while leaving the other paths completely unaffected. To do this, the direct paths varying in opposite directions from one structure to the other with respect to the longitudinal axis Y of symmetry of the assembly and on proceeding away from the latter, although the relative offsets between channels are equal in absolute values for each of these two structures.

In other words this variant amounts to embodying a filter by using two previous structures, each with N channels, so as to afford further rejection on all the paths of odd order, while leaving the other paths completely unaffected. To do this the inter-transducer distances of the N channels of the two structures must follow the following arithmetic progressions, making it possible to afford a phase shift between structures which is equal to an even multiple of $\lambda$ for the paths of even order and equal to an odd multiple of $\lambda$ for the paths of odd order (including the direct path):

$$\begin{cases} X + \frac{2n-(N+1)}{2N} \quad (kN+1)\lambda + (2M+1) \\ \lambda/4 \text{ for the 1st structure} \\ \begin{cases} X - \frac{2n+(N+1)}{2N} \quad (kN+1)\lambda + (2M+1) \end{cases} \\ \lambda/4 \text{ for the 2nd structure} \end{cases}$$

The new form of the transfer function is thus approximately the following:

$$\sum_{n=1}^{N} F_n \left[(kN+1) n\pi f/fo\right] e^{-jn\phi} \begin{Bmatrix} \cos n\Delta \\ j\sin n\Delta \end{Bmatrix} \begin{matrix} \ldots n \text{ odd} \\ T_1 T_2 R^{n-1} \\ \ldots n \text{ even} \end{matrix} \cos\left[\frac{n\pi}{2} (2M+1) f/fo\right]$$

a form in which the further filtering effected on the paths of odd order via the last cosine term is actually apparent.

Figure 8:
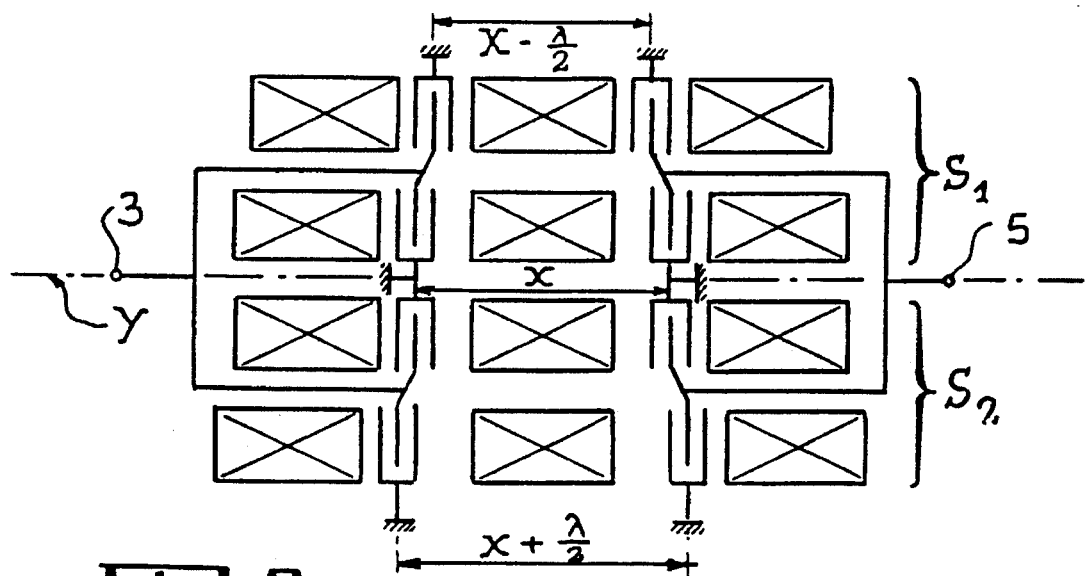
FIG. 8 shows an improved variant of the filter according to FIG. 2.
Figure 9:
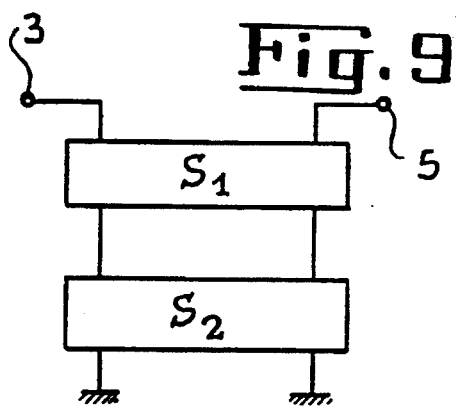
FIGS. 9 to 12 are synoptics of possible set-ups for this kind of improved variant.
Figure 10:
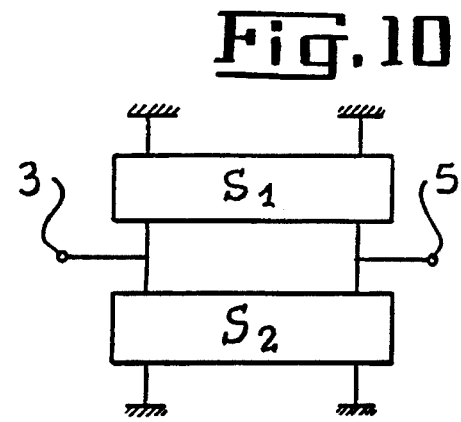
Figure 11:
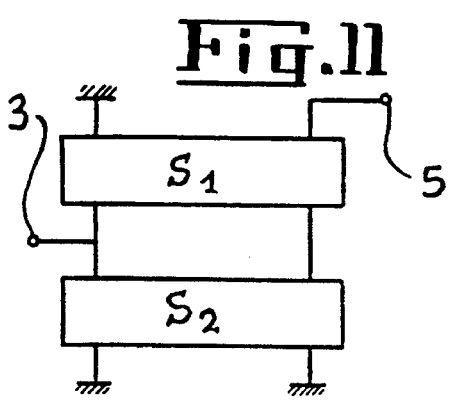
Figure 12:
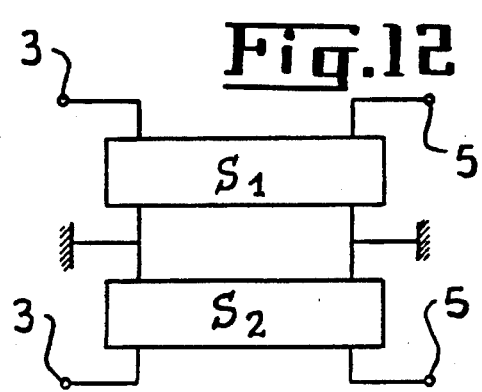

Returning to the previous case (N=2 and k=0), it is readily found that the rejection of the direct path expressed in dB is doubled:

total for f=fo 72 dB for f=(1±1%) fo 44 dB for f=(1±5%) fo 20 dB for f=(1±20%) fo A simple embodiment applied to this latter case is represented in FIG. 8. In this instance we have a filter embodying the placing in parallel of two structures S1, S2 both similar to the structure according to FIG. 2, but in which the inter-transducer distances are:

X−λ/2 and X for the structure S1; and

X and X+λ/2 for the structure S2, thus giving a difference of λ/2 for all the direct paths of like rank.

As in the case of channels themselves, it is quite obvious that all types of electrical connections between the two structures S1 and S2 can be envisaged and, in this regard, FIGS. 9 to 12 show respectively four types of possible connections: series-series, parallel-parallel, parallel-series, and differential set-up (in this last variant, the connection of the centre-tap to earth is not obligatory).

The previous structures are very suitable when desiring to obtain low insertion losses since they operate "under resonance". These losses are typically of the order of −3 dB and therefore the number of reflector lines of the outside gratings must be as large as possible.

The sensitivity of a transducer to the elements which make it possible to carry out electrical tuning is all the larger the higher its Q-factor. Recall that the Q-factor is defined as the ratio of the susceptance of the transducer to its conductance. This coefficient equals $k^2/M$, where $k^2$ is the piezoelectric coupling coefficient of the material and M the number of active electrodes of the transducer. Since we wish to reduce this sensitivity, for a given material we are led to increase M.

Moreover, it is always of interest to reduce the length of the component for reasons of volume and cost.

All these considerations lead to the embedding of the reflectors of the outside gratings into the transducers to constitute transducers known by the name "DART" (short for Distributed Acoustic Reflection Transducer). Indeed, in this way, for a given length we have maximum reflector lines on the one hand and maximum active electrodes on the other hand.

Figure 14:
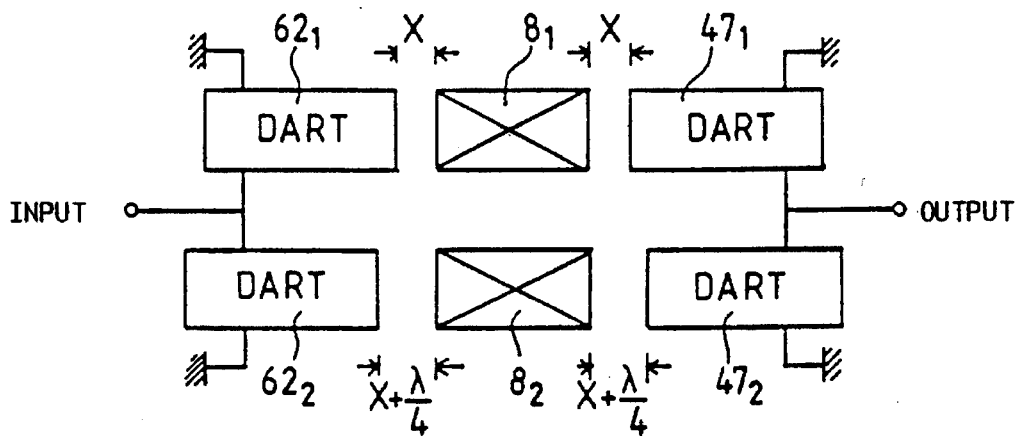
FIG. 14 shows a variant of the invention in which transducers and the outside reflectors are joined up to form "DARTs"

The general structure represented in FIG. 14 is therefore obtained, including two central reflectors $8_1$ and $8_2$ and four transducers/reflectors of the DART type $62_1$, $62_2$, $47_1$ and $47_2$. This applies to all the variants, in particular those of FIGS. 9 to 12 which will be described further on.

Figure 15:
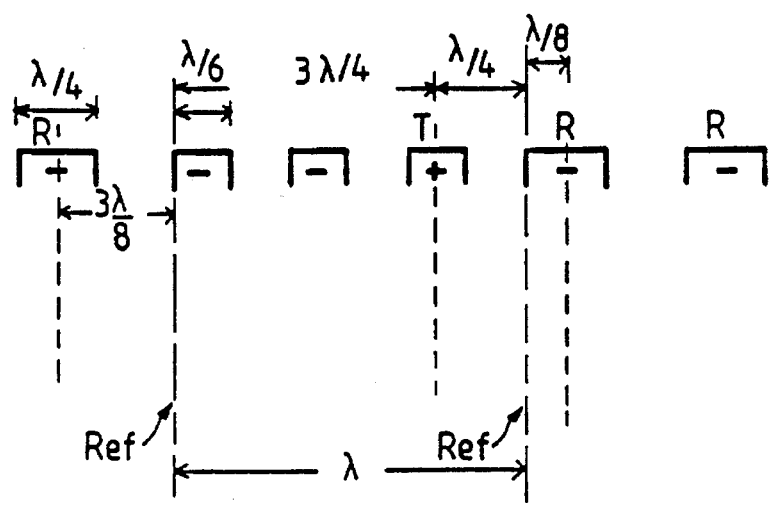
FIGS. 15 to 18 show variants of elementary cells of the DARTs of FIG. 14.

A DART structure is known from French Patent No. 2 653 632 filed by the Applicant on 20 Oct. 1989. The simplest version of the basic cell of this structure is represented in FIG. 15. This version comprises a transmitting cell including 3 electrodes and a reflective cell including 2 electrodes.

Figure 16:
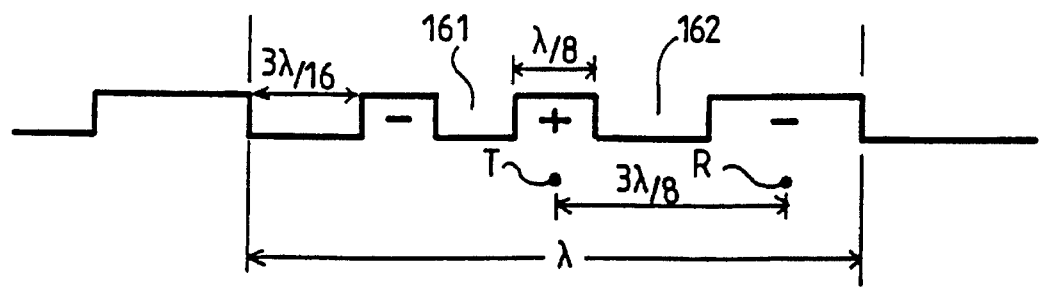

Another DART structure, known by the name EWC (short for Electrode Width Control), is formed from cells of length 1 λ, each including a reflector and a source, as represented in FIG. 16.

This structure has, by comparison with the previous structure, the advantages of not generating subharmonics and of allowing a better reflection/transduction compromise.

Figure 17:
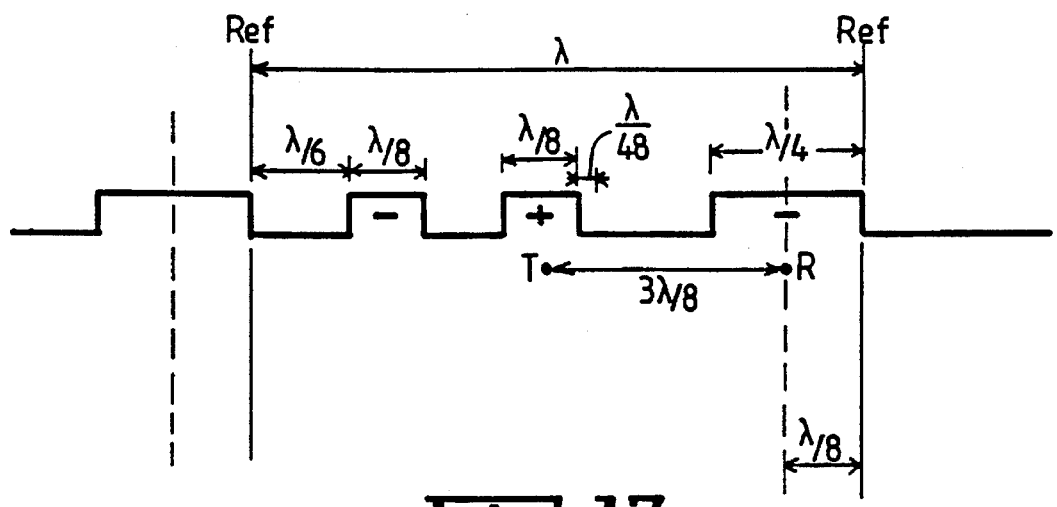
Figure 18:
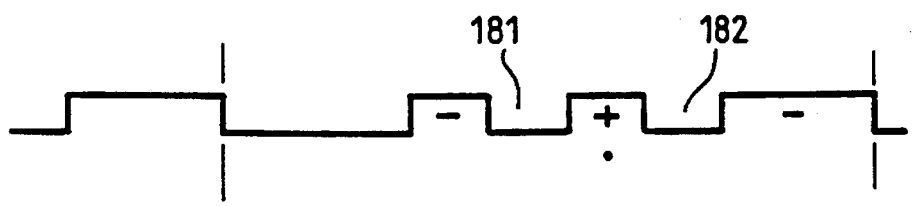

FIG. 16 constitutes the basic cell in which the centres of transduction T and of reflection R are placed respectively at the centre of the + electrode and at the centre of the reflector. In fact, this structure is not optimal since the + electrode being surrounded by 2 different inter-electrode gaps $16_1$ and $16_2$, its centre of transduction is not precisely at the centre of this electrode. To alleviate this disadvantage, another structure consists in offsetting the source (that is to say both λ/8 electrodes [lacuna] by a distance Δx from the 3 λ/8 position. Thus, the reflections on the 2 electrodes of width λ/8) [sic] continue to be in phase opposition and an appropriate choice of Δx makes it possible to place the centre of transduction at the optimal point (3λ/8 from the reflector). For quartz, experiment shows that the value Δx to obtain this result is close to +λ/48 as represented in FIG. 17. According to a variant represented in FIG. 18, an offset Δx=−λ/16 is used, this enabling the 2 inter-electrode gaps $18_1$ and $18_2$ to be rendered equal and facilitating synthesis of the filter. However, the optimal distance 3λ/8 is then no longer complied with, thus causing more sizeable undulations than previously, but which for certain applications may be accepted.

The structure of the 2 DARTs is such that the short-circuit reflection coefficients are equal. However, this condition does not impose complete identity of these 2 DARTs. Thus the transductions may be different. If it is wished, in particular, to obtain better rejection by further filtering of the direct path one of the DARTs (or both) may be weighted by source suppression (the sources being the active electrodes), or else by varying overlap of the fingers. This latter means will be preferred, in a DART only, when it is wished to obtain good far-field rejection.

The invention can also be extended, by replacing the "transducer/outer reflector" assembly by any directive device (totally or partially unidirectional) such as "3 phase" or group transducer, bi-directional transducer placed inside a folded-back 3 dB multipliline [sic] coupler; etc.

These structures make it possible to obtain greater attenuation of the parasitic signals due to bulk waves. Indeed, the bulk waves being scarcely affected by the surface metallizations (or etchings) are scarcely reflected by the central reflector. Hence, only the direct path is relevant to these waves and since the structure enables this path to be eliminated, the bulk waves are greatly diminished. Experimentally, it has been observed that it was unnecessary to treat (generally by sand-blasting) the rear face of the substrate to obtain filters with rejection of the order of −60 dB. Thus, very high rejections can be envisaged with such treatment.

We claim:

1. Surface acoustic wave filter comprising:

longitudinal resonant cavities, forming an integer number N, equal to at least 2, of parallel filtering channels each including;

an input transducer and an output for each of said filtering channels having a direct path between each said input and output transducers;

at least two reflecting gratings in each of said filtering channels;

the transmission amplitudes being, at least for each said direct path, substantially the same for these N channels;

wherein, the difference in propagation length in the direct path is defined by the center-point distance from said input transducer to a corresponding said output transducer and is, for two consecutive channels, substantially equal, to within an integer number of wavelengths ($\lambda$) at the central filter frequency (fo), to one Nth of this wavelength ($\lambda$), so that for this central frequency (fo), the vector resultant of the signals of these N channels which correspond to the direct paths is substantially zero and that in consequence there is substantially cancellation of the delay line transfer function outside the stop band of the filter; and wherein, each center-point distance from each said input and said output transducers to a closest said reflecting grating are equal.

2. Filter according to claim 1, wherein each transducer/reflector pair forms a single device of the DART type.

3. Filter according to claim 2, wherein that the short-circuit reflection coefficients of the DART devices are equal.

4. Filter according to either one of claims 2 and 3, wherein at least one of the DART devices is weighted by source suppression.

5. Filter according to either one of claims 2 and 3, wherein at least one of the DART devices is weighted by variable overlap of the fingers.

6. Filter according to any one of claims 2 and 3, wherein at least one of the DART devices is of the EWC type with a $\lambda/48$ offset.

7. Filter according to any one of claims 2 and 3, wherein at least of the DART devices is of the EWC type with a $-\lambda/16$ offset.

8. Filter according to any one of claims 2 and 3, wherein at least one of the DART devices is formed by a set of alternating transmitting cells and reflecting cells, each transmitting cell including three electrodes of width $\lambda/6$ spaced $3\lambda/4$ apart over a distance equal to $\lambda$ with two inactive electrodes followed by an active electrode, and each reflecting cell including two inactive electrodes of width $\lambda/4$ spaced $3\lambda/8$ apart over a distance equal to $\lambda$.

9. Surface wave filter according to claim 1, wherein said filter is placed on a single substrate and wherein a longitudinal groove is gouged into this substrate between each of the said channels to isolate them from one another in respect of the surface acoustic waves.

10. Surface wave filter according to claim 1, wherein said filter is placed on a single substrate and in that a longitudinal layer of a material absorbent in respect to the surface acoustic waves is deposited between each of the said channels.

11. Surface wave filter according to claim 1, wherein characterized in that each of these channels is symmetric with respect to the mid-line of the inter-transducer gap.

12. Surface wave filter according to claim 1, wherein each of these channels includes a central reflector and two outer reflectors.

13. Surface wave filter according to claim 1, wherein said filter it includes an odd number of channels and in that each of these channels is without a central reflector but replete with outer reflectors, the angle of the modulus of the reflection coefficient therefore being chosen as zero.

14. Surface wave filter according to claim 1, wherein said filter ensures rejection in the direct path for the frequencies which, in the stop band, are distant from the said central frequency by the placing in parallel of two of these aforesaid multichannel structures, these structures being of the same type, but the offsets of the direct paths is X−$\lambda/2$ and X+$\lambda/2$, wherein X is the direct path, said offsets varying in opposite directions from one structure to the other with respect to the longitudinal axis of symmetry of the assembly and on proceeding away from the latter.

15. Filter according to claim 1 wherein the number of electrodes of the central reflector is chosen so that the reflection coefficient is substantially equal to −3 dB.

16. Filter according to claim 15, wherein the central reflector (81, 82) is furthermore weighted by electrode suppression and that it includes neutral cells which replace the suppressed electrodes so as to maintain a constant metallization ratio.

17. Surface wave filter according to claim 1, wherein said filter is placed on a single substrate and in that the said channels are offset longitudinally with respect to one another so as to cancel, by placing in phase opposition, the couplings between these channels.

18. Filter according to claim 1, wherein said filter comprises no processing against the bulk waves of the substrate on which the members of the filter are installed.

19. The surface acoustic wave filter of claim 1, further comprising:

at least three said parallel filtering channels having a common input for each of said input transducers and a common output for each of said output transducers;

wherein, a direct path length for each of the parallel filtering channels (V1, V2, . . . VN) is set by the following empirical equation:

X for channel V1

X+$\lambda/2N$ for channel V2

X+$\lambda/N$ for channel V3

X+(N−2).$\lambda/2N$ for channel VN−1 and, X+(N−1).$\lambda/2N$ for channel VN; and wherein, X is a distance for the direct path of the first channel, N is a total number of said parallel filtering channels, VN is a number for the parallel filtering channels, and $\lambda$ is the wavelength of the central frequency passed by said filter.

20. The surface acoustic wave filter of claim 1, further comprising:

a first pair of said parallel filtering channels having a direct path length X for one of the parallel filtering channels of said first pair and a direct path X−λ/2 for a second of the parallel filtering channels of said first pair;

a second pair of parallel filtering channels, one of the parallel filtering channels of said second pair having said direct path length X and a second parallel filtering channel of said second pair having a direct path defined by the distance X−λ/2; and wherein, the input transducers for said first and said second pair of said parallel filtering channels have a common input and said output transducers of said first and second pairs of said parallel filtering channels have a common output.

\* \* \* \* \*